US011092318B2

(12) United States Patent
Li

(10) Patent No.: US 11,092,318 B2
(45) Date of Patent: Aug. 17, 2021

(54) LED FLEXIBLE LIGHT BAR

(71) Applicant: Zhongshan Lande Electronics Co., Ltd., Guangdong (CN)

(72) Inventor: Xiongwei Li, Zhejiang (CN)

(73) Assignee: Zhongshan Lande Electronics Co., Ltd., Zhongshan (CN)

( * ) Notice: Subject to any disclaimer, the term of this patent is extended or adjusted under 35 U.S.C. 154(b) by 0 days.

(21) Appl. No.: 16/882,532

(22) Filed: May 24, 2020

(65) Prior Publication Data

US 2020/0284407 A1 Sep. 10, 2020

Related U.S. Application Data

(63) Continuation of application No. PCT/CN2019/107120, filed on Sep. 20, 2019.

(30) Foreign Application Priority Data

Feb. 10, 2019 (CN) .......................... 201920188844.1

(51) Int. Cl.
*F21V 19/00* (2006.01)
*F21V 23/00* (2015.01)
*H05K 1/18* (2006.01)
*F21Y 103/10* (2016.01)
(Continued)

(52) U.S. Cl.
CPC ........ *F21V 19/0025* (2013.01); *F21V 23/001* (2013.01); *H05K 1/181* (2013.01); *H05K 1/189* (2013.01); *F21S 4/28* (2016.01); *F21Y 2103/10* (2016.08); *F21Y 2115/10* (2016.08);
(Continued)

(58) Field of Classification Search
CPC ........... F21S 4/24; F21S 4/28; F21V 19/0025; F21V 23/001; F21V 23/002; F21V 23/003; F21V 23/004; F21V 23/005; F21V 19/001; F21V 19/0015; H05K 1/181; F21Y 2103/10; F21Y 2115/10; F21K 9/278; H01L 33/62; H01L 25/13; H01L 25/0753; H01L 23/528; H01L 2933/0066
See application file for complete search history.

(56) References Cited

U.S. PATENT DOCUMENTS 3,894,225 A * 7/1975 Chao .......................... F21S 4/20
362/249.08
7,021,792 B2 * 4/2006 Lin ............................ F21S 4/26
362/219
(Continued)

FOREIGN PATENT DOCUMENTS

CN 203118987 U 8/2013
CN 207962198 U 10/2018

*Primary Examiner* — Jong-Suk (James) Lee
*Assistant Examiner* — James M Endo

(57) ABSTRACT

An LED flexible light bar having a circuit board (2), LED flip chips (3) are arranged at an upper end of the circuit board (2). The LED flip chips (3) and the circuit board (2) are connected together by a plurality of solder paste bumps (16). Compared with the conventional art, the LED flexible light bar has beneficial effects of simple product structure, less investment in production equipment, reduced manpower requirements, easy implementation of assembly line production, higher production efficiency, lower production costs and the like, and is suitable for both a Flexible Printed Circuit (FPC) and a Printed Circuit Board (PCB) with a wider range of application.

7 Claims, 6 Drawing Sheets

(51) Int. Cl.
*F21Y 115/10* (2016.01)
*F21S 4/28* (2016.01)

(52) U.S. Cl.
CPC ............ *H05K 2201/10106* (2013.01); *H05K 2201/10674* (2013.01); *H05K 2201/10984* (2013.01)

(56) References Cited

U.S. PATENT DOCUMENTS

| | | | | |
|---|---|---|---|---|
| 8,786,200 B2* | 7/2014 | Tischler | ................ | H05B 45/48 315/185 R |
| 2006/0043382 A1* | 3/2006 | Matsui | ................ | H01L 25/0753 257/79 |
| 2009/0154156 A1* | 6/2009 | Lo | ........................ | H05K 1/189 362/234 |
| 2009/0224265 A1* | 9/2009 | Wang | ....................... | F21K 9/00 257/88 |
| 2012/0009700 A1* | 1/2012 | Wang | ....................... | F21K 9/00 438/27 |
| 2012/0044669 A1* | 2/2012 | Ogata | ....................... | F21K 9/23 362/97.3 |
| 2014/0061684 A1* | 3/2014 | Marutani | ................ | H01L 33/62 257/88 |
| 2014/0077236 A1* | 3/2014 | Yamada | .................. | H01L 33/56 257/88 |
| 2014/0140079 A1* | 5/2014 | Marutani | ................ | F21V 21/14 362/418 |
| 2014/0209928 A1* | 7/2014 | Teng | ..................... | H01L 25/167 257/82 |
| 2014/0264407 A1* | 9/2014 | Tischler | ............. | H01L 25/0753 257/91 |
| 2014/0362565 A1* | 12/2014 | Yao | ..................... | H01L 25/0753 362/223 |
| 2015/0129909 A1* | 5/2015 | Speer | .................. | H01L 25/0753 257/91 |
| 2017/0138583 A1* | 5/2017 | Ito | .......................... | H01L 33/62 |

* cited by examiner

A-A

LED FLEXIBLE LIGHT BAR

CROSS REFERENCE TO RELATED APPLICATIONS

The present application is a Continuation Application of PCT Application No. PCT/CN2019/107120 filed on Sep. 20, 2019, which claims the benefit of Chinese Patent Application No. 201920188844.1 filed on Feb. 10, 2019. All the above are hereby incorporated by reference. the contents of which are incorporated herein by reference in their entirety.

TECHNICAL FIELD

The present invention relates to the technical field of LED lighting, and more particularly, to an LED flexible light bar.

BACKGROUND

As the fourth-generation lighting source, LED lamps have significant energy saving and longevity advantages. With the development of society, the problem of lighting energy consumption in daily life is becoming more and more prominent. Therefore, LED lamps with significant energy saving advantages are more and more popular. The core component of an LED lamp is an LED chip, and has a main function of converting electrical energy into light energy. A packaging method and an assembly process directly affect the energy consumption and lighting effect of the lamp.

An LED flexible light bar is formed by soldering an LED lamp to a copper wire or a strip-shaped Flexible Printed Circuit (FPC) with a special processing technology, and then connecting a power supply to emit light, and is named because it is shaped like a light strip when it emits light. The LED flexible light bar is widely used in buildings, bridges, roads, gardens, courtyards, floors, ceilings, furniture, cars, ponds, underwater, advertising, signboards, signs and other fields, and used as decoration or lighting. At present, LED flexible light bars on the market are usually composed of FPCs and LED light-emitting chips. After multiple processes such as supporting, solid crystal, bonding wires, dispensing, and splitting, an SMT technology is used to attach the chips to the FPCs. The process is complex, the quality of the key links such as support soldering, fixing, and dispensing of the chip is difficult to control, it is prone to quality problems such as explosion glue, virtual soldering, and vulcanization, and the defective rate is higher in the production process.

Therefore, it is necessary to propose a new LED flexible light bar to improve the common defects of the current light bar.

SUMMARY

The purpose of the present invention is to provide an LED flexible light bar using LED flip chips to solve the problems of complicated processing technology and high defective rate of the LED light bar proposed in the background.

To achieve the above object, the present invention provides the following technical solutions.

An LED flexible light bar includes a circuit board. At least one LED flip chip is arranged at an upper end of the circuit board. The LED flip chip and the circuit board are connected together by a plurality of solder paste bumps.

Further, the LED flip chip is further covered with toner glues.

Further, the LED flexible light bar further includes a flexible housing, and the circuit board is disposed in the flexible housing.

Further, the circuit board is an FPC or a Printed Circuit Board (PCB).

Further, wires on the circuit board are arranged at an equal interval.

Further, a minimum interval between two adjacent solder paste bumps of the same LED flip chip is 0.12 mm.

Further, a minimum interval between the LED flip chips is 0.08 mm.

Further, the FPC includes a top insulating film, an intermediate conductive circuit layer and a bottom insulating film. The conductive circuit layer includes two power lines, a plurality of series lines and/or parallel lines. The LED flip chip is soldered on the series lines and/or the parallel lines. The top insulating film is provided with a first through hole corresponding to the position of each LED flip chip. The LED flip chip is accommodated in the first through hole.

Further, the series line includes a series line body, the parallel line includes a parallel line body, an end of the series line body and/or the parallel line body close to the LED flip chip is extended with a solder branch, the width of the solder branch is less than that of the series line body or the parallel line body, and the LED flip chip is soldered to an end of the solder branch.

The top insulating film is pasted to cover at least a portion of the solder branch close to the series line body or the parallel line body.

The width of the solder branch is less than half of the width of the series line body or the parallel line body.

An end of the solder branch close to the LED flip chip is extended with a pad, the width of the pad is greater than that of a solder branch body of the solder branch, the width or length of the pad is greater than or equal to the width of the LED flip chip, and an electrode of the LED flip chip is directly soldered on the pad.

Further, toner glue is provided at a position corresponding to each LED flip chip, and the toner glue covers at least the LED flip chip and the first through hole.

The power lines and the series lines are located on the same level, and the power lines are located on both sides of the series lines.

The LED flip chips are connected in series through the series lines and then connected in parallel to the two power lines, the solder branches extending from two adjacent series lines are not on the same straight line, the two solder branches are distributed in parallel up and down, the LED flip chips are placed horizontally, and the length direction of the LED flip chips is consistent with the width direction of the FPC; or, the solder branches extending from two adjacent series lines are on the same straight line, the LED flip chips are placed vertically, and the length direction of the LED flip chips is consistent with the length direction of the FPC.

Or, the LED flip chips are connected in parallel to two power lines through parallel lines.

Or, the power lines and the series lines are located on two different levels, the two power lines are located below the series lines, the LED flip chips are connected in series through the series lines and then connected to the two power lines in parallel, and an intermediate insulating film is disposed between the power line and the series line.

Compared with the conventional art, the beneficial effects of the present invention are as follows:

1. The product structure and process are simple, the production yield rate is higher and the manufacturing cost is lower. The product structure is simplified, a conventional support structure is removed, an LED flip chip is used to be soldered directly to a circuit board through solder paste instead, the support fixing, solid crystal, welding wire and other processes are eliminated, the occurrence of defective products such as glue explosion, virtual welding, and vulcanization are reduced, the investment of production equipment and labor is reduced, and the purpose of reducing the production cost is achieved.

2. The assembly line production is realized. The production process is relatively simple, continuous production can be concentrated in the same production line, and the production efficiency is higher.

3. The application is wider. The structure product is suitable for FPCs and PCBs. The size of the circuit board and chip can be designed according to needs, and the application is wider.

1, flexible housing; 2, circuit board; 3, LED flip chip; 4, top insulating film; 5, conductive circuit layer; 6, bottom insulating film; 7, power line; 8, series line; 9, first through hole; 10, series line body; 11, solder branch; 11a, a portion of solder branches; 11b, another portion of solder branches; L, joint; 12, pad; 13, solder branch body; 14, toner glue; 15, chip resistor; 16, solder paste bump.

DETAILED DESCRIPTION OF THE EMBODIMENTS

The technical solutions in the embodiments of the present invention will be clearly and completely described hereinbelow with the drawings in the embodiments of the present invention. It is apparent that the described embodiments are only part of the embodiments of the present invention, not all of the embodiments. On the basis of the embodiments of the present invention, all other embodiments obtained on the premise of no creative work of those of ordinary skill in the art fall within the scope of protection of the present invention.

Embodiment 1

Figure 1:
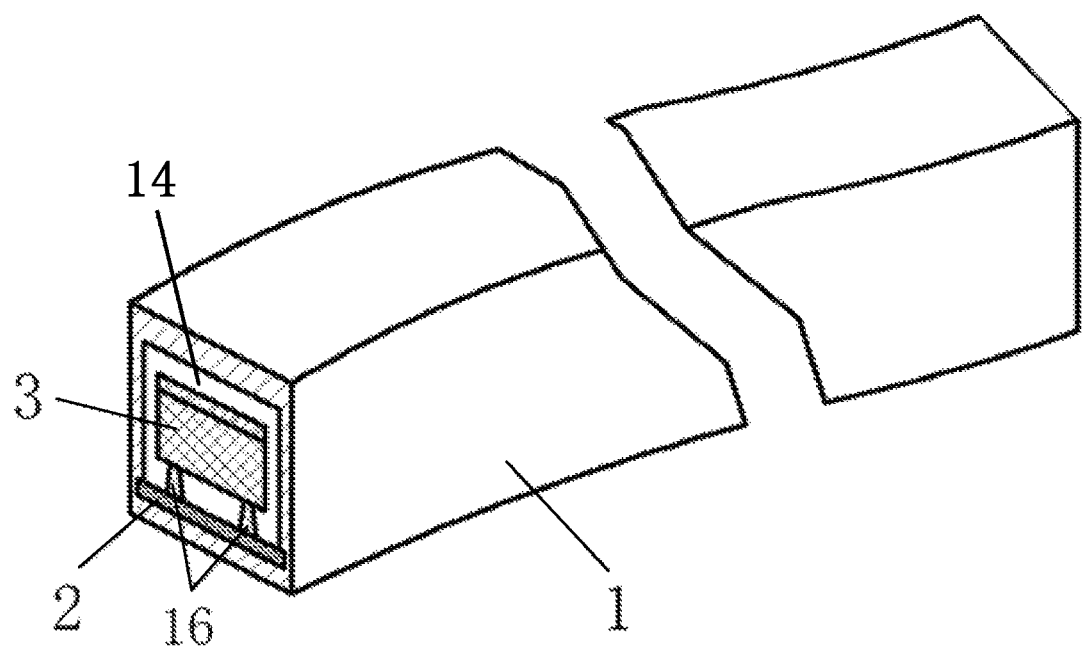
FIG. 1 is a schematic stereostructure diagram of Embodiment 1 of an LED flexible light bar of the present invention.
Figure 2:
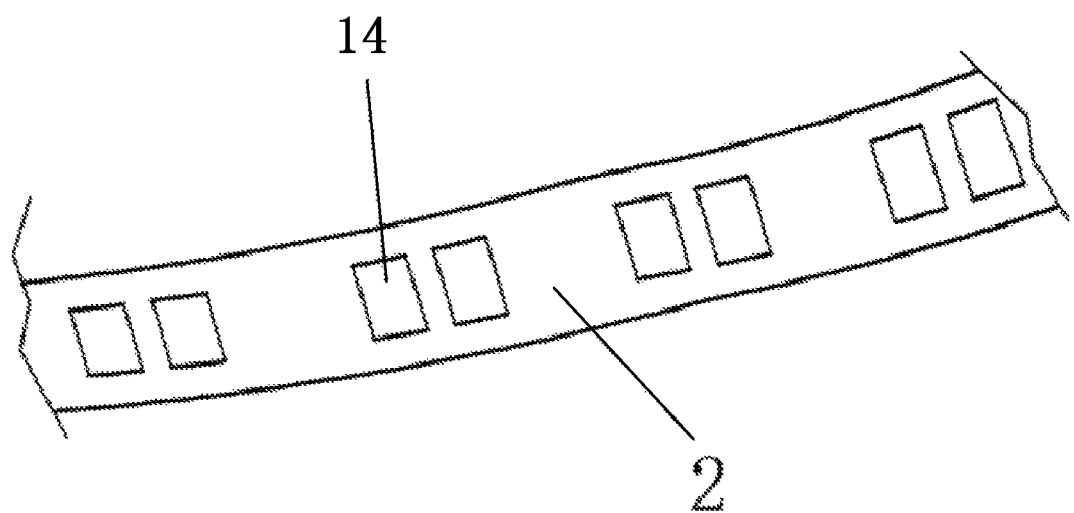
FIG. 2 is a schematic internal plane structure diagram of Embodiment 1 of an LED flexible light bar of the present invention.

Embodiment 1 is used in the case of high voltage (80-130V, 200-240V). Referring to FIG. 1 and FIG. 2, the present invention provides a flexible LED light bar, including a flexible housing 1. The flexible housing 1 is provided with a circuit board 2. At least one LED flip chip 3 is arranged at an upper end of the circuit board 2. The LED flip chip 3 and the circuit board 2 are connected together through a plurality of solder paste bumps 16.

Specifically, the circuit board 2 is a PCB. If a PCB is used, a small piece of PCB may be fixed on a soft carrier tape to achieve bending of the light bar.

Specifically, wires on the circuit board 2 are arranged at an equal interval, which is convenient for simplifying the production process of the assembly line and improving production efficiency.

Specifically, a minimum interval between two adjacent solder paste bumps 16 of the same LED flip chip 3 is 0.12 mm. This size may be changed according to different needs of the product and different sizes of the LED flip chip.

Specifically, an upper surface of the LED flip chip 3 is also covered with toner glue 14 for adjusting the color temperature and color of light, playing an insulating role, and protecting the LED flip chip 3.

The thickness of the toner glue 14 is 2-5 mm, and as the thickness is larger, the light emission is more uniform. The toner glue 14 is a soft glue.

Specifically, the LED flip chip 3 is a blue-ray LED flip chip 3, and the toner glue 14 is formed by mixing fluorescent powder in transparent silica gel. The color temperature and color of light may be adjusted by adding fluorescent powder to silica gel. Table 1 and Table 2 are two kinds of powder mixing record table.

TABLE 1

| Warm white | | | White light type | |
|---|---|---|---|---|
| 76 g | SDY548-15<br>0.19 g | Model<br>Dosage | Powder 1 | Fluorescent<br>powder |
| 3.32 g | SSDR630D1-1<br>0.0083 g | Model<br>Dosage | Powder 2 | |
| | | Model<br>Dosage | Powder 3 | |
| 1.48 g | DM-30<br>0.0037 g | Model<br>Dosage | Powder 1 | Anti-precipitation<br>powder |
| | | Model<br>Dosage | Powder 1 | Diffusion<br>powder |
| 13.6 g | KMT-1360A<br>0.034 g | Model<br>Dosage | A component | Mixing<br>silica gel |
| 136 g | KMT-1360B<br>0.34 g | Model<br>Dosage | B component | |

TABLE 2

| Pure white | | Neutral white | | Warm white | | | | |
|---|---|---|---|---|---|---|---|---|
| 38 g | SDY548-15<br>0.19 g | 38 g | SDY552-15<br>0.19 g | 76 g | SDY548-15<br>0.19 g | Model<br>Dosage | Powder 1 | Fluorescent<br>powder |
| 0.48 g | SSDR620W<br>0.0024 g | 2.24 g | SSDR620W<br>0.0112 g | 3.32 g | SSDR630D1-1<br>0.0083 g | Model<br>Dosage | Powder 2 | |
| | | | | | | Model<br>Dosage | Powder 3 | |
| | DM-30 | | DM-30 | | DM-30 | Model | Powder 1 | Anti-precipitation |

TABLE 2-continued

| Pure white | | Neutral white | | Warm white | | | | White light type |
|---|---|---|---|---|---|---|---|---|
| 2.34 g | 0.0117 g | 1.92 g | 0.0096 g | 1.48 g | 0.0037 g | Dosage Model Dosage | Powder 1 | powder Diffusion powder |
| | KMT-1360A 0.076 g | | KMT-1360A 0.072 g | | KMT-1360A 0.034 g | Model Dosage | A component | Mixing silica gel |
| 15.2 g | | 14.4 g | | 13.6 g | | Model | B | |
| | KMT-1360B 0.76 g | | KMT-1360B 0.72 g | | KMT-1360B 0.34 g | Dosage | component | |
| 152 g | | 144 g | | 136 g | | | | |

Specifically, a minimum interval between the LED flip chips (3) is 0.08 mm.

Working Principle:

According to the parameter specifications of the LED flip chip 3 used, a suitable FPC or PCB 2 is selected and designed, the appropriate pad specifications of a soldering furnace are set, dispensing parameters are set, after all preparations are completed, soldering equipment, dispensing equipment and silicone shell molding equipment are started, the LED flip chip 3 and the circuit board 2 are soldered together through solder paste, a substrate of the LED flip chip 3 is protected by dispensing, and finally, the flexible housing 1 is molded outside the entire product to complete the product production. When the product is powered on, the LED flip chip 3 converts electrical energy into light energy to achieve light emission. The flexible housing 1 may be appropriately bent and deformed according to different materials of the circuit board 2 selected inside, but it is necessary to avoid direct 90° right-angle bending.

Embodiment 2

Figure 3:
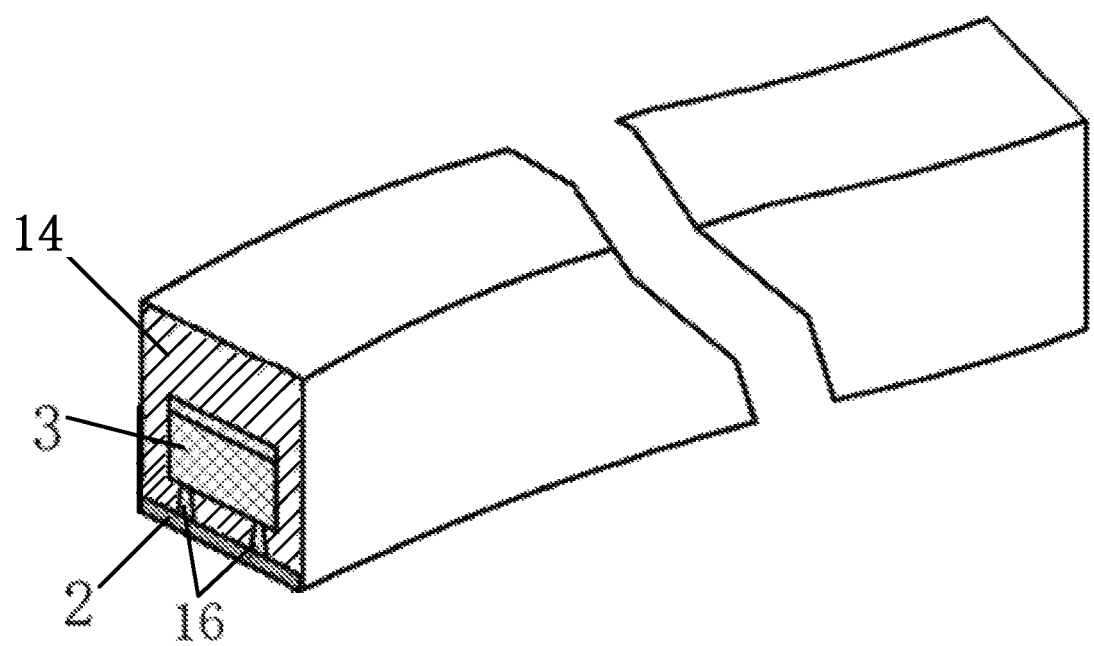
FIG. 3 is a schematic stereostructure diagram of Embodiment 2 of an LED flexible light bar of the present invention.
Figure 4:
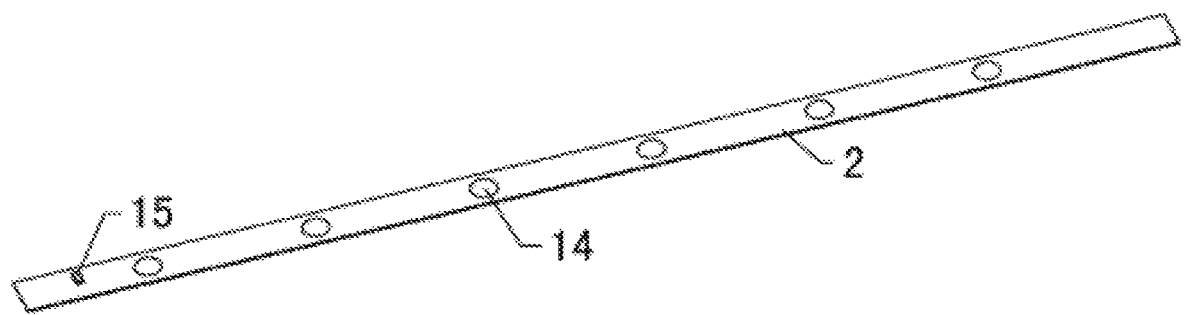
FIG. 4 is a stereostructure diagram of Embodiment 3 of an LED flexible light bar of the present invention.
Figure 5:
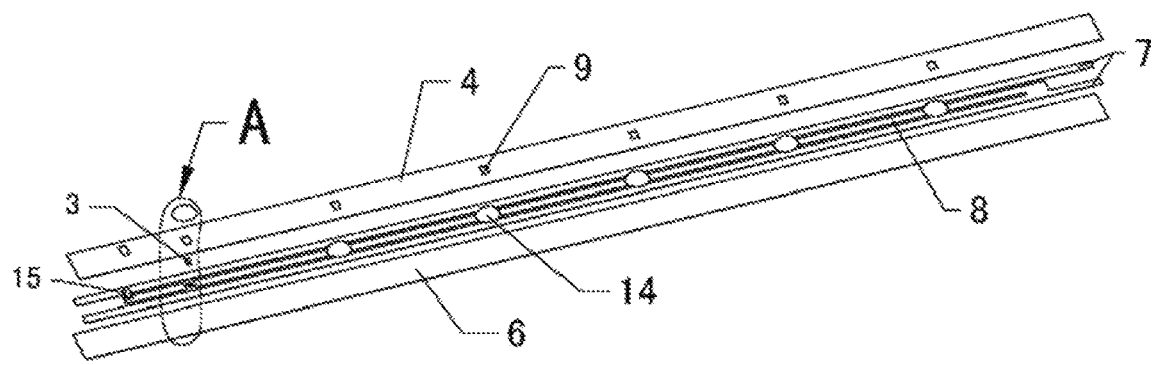
FIG. 5 is an exploded view of Embodiment 3 of a flexible LED flip flexible light bar of the present invention.
Figure 6:
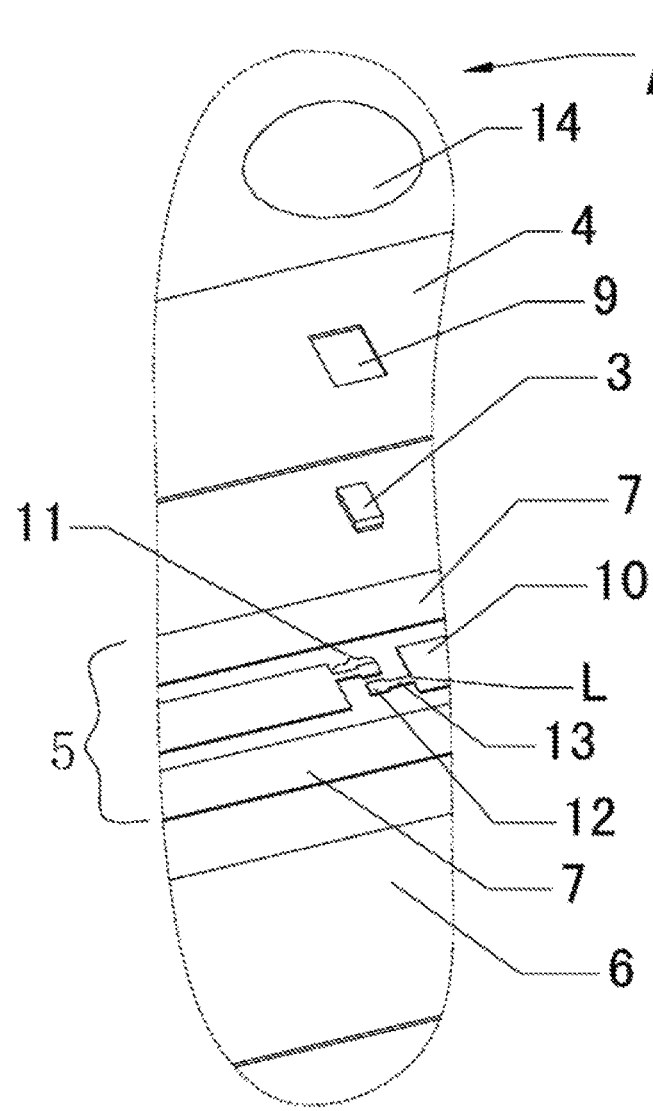
FIG. 6 is an enlarged view of part A in FIG. 5.
Figure 7:
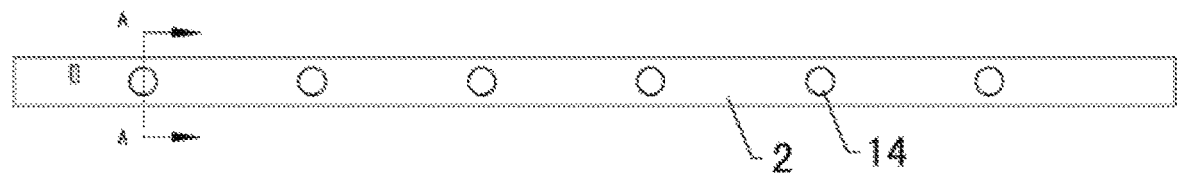
FIG. 7 is a top view of Embodiment 3 of a flexible LED flip flexible light bar of the present invention.
Figure 8:
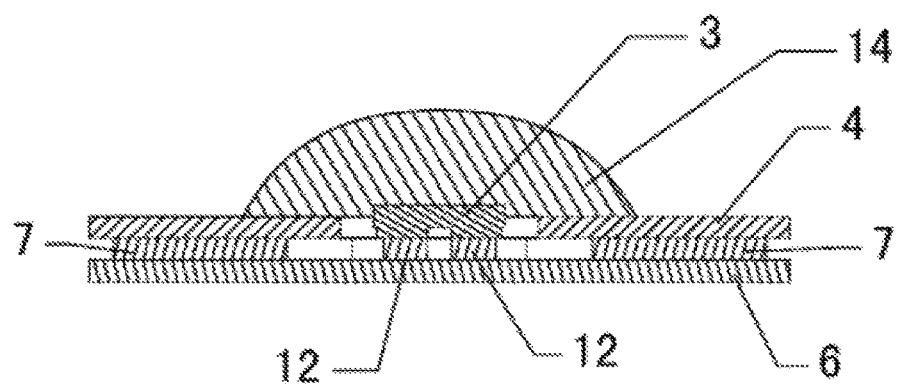
FIG. 8 is a cross-sectional view of A-A in FIG. 7.
Figure 9:
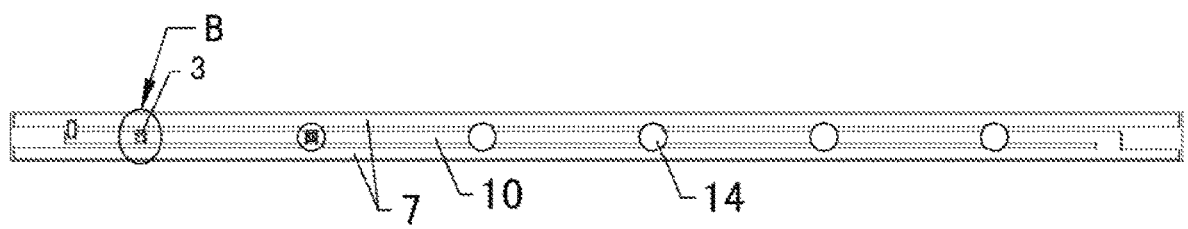
FIG. 9 is a top view of Embodiment 3 of a flexible LED flip flexible light bar of the present invention without a top insulating film.

Embodiment 2 is used in the case of low voltage (12V, 24V, 36V), referring to FIG. 3, its structure is substantially the same as that of Embodiment 1, and the main difference is that: the flexible housing 1 is removed; and it has 350 LED flip chips 3 adopting a series-parallel connection mode of 7-series and 50-parallel.

Embodiment 3

The structure of Embodiment 3 is substantially the same as that of Embodiment 1, and the main difference is that: the circuit board 2 is an FPC.

Referring to FIG. 4 to FIG. 9, specifically, the FPC includes a top insulating film 4, an intermediate conductive circuit layer 5 and a bottom insulating film 6. The conductive circuit layer 5 includes two power lines 7, and a plurality of series lines 8. The LED flip chips 3 are soldered on the series lines 8. The top insulating film 4 is provided with a first through hole 9 corresponding to the position of each LED flip chip 3. The LED flip chips 3 are accommodated in the first through holes 9.

Specifically, the series line 8 includes a series line body 10. An end of the series line body 10 close to the LED flip chip 3 is extended with a solder branch 11. The width of the solder branch 11 is less than that of the series line body 10. The LED flip chip 3 is soldered to an end of the solder branch 11. The thinner solder branch 11 of the series line body 10 may serve as a force buffering portion. Since the solder branch 11 is thinner and has higher flexibility, when an LED strip lamp 1 is bent, basically only the series line body 10 is bent and forced. The force of soft solder branch 11 is extremely small, and the solder branch 11 is used to solder the end of the flip-chip LED flip chip 3 with less stress, so that the LED flip chip 3 will not be cracked and broken by stress when the LED strip lamp 1 is bent like the chip LED, and the quality is more reliable.

Specifically, the top insulating film 4 is pasted to cover a portion of the solder branch 11 close to the series line body 10. Because the width of the solder branch 11 is different from that of the series line body 10, when a joint between the solder branch 11 and the series line body 10 is bent multiple times, it is relatively more likely to be broken by an external force, just like easy breakage of a joint between a plug and a wire. The top insulating film 4 is pasted to cover at least a portion of solder branch 11a close to the series line body 10, and another portion of solder branch 11b is exposed in the first through hole 9. A joint L between the solder branch 11 and the series line body 10 is pasted and protected by the top insulating film 4, so that the joint L cannot be broken by an external force, and the quality is more reliable.

Specifically, an end of the solder branch 11 close to the LED flip chip 3 is extended with a pad 12, the width of the pad 12 is greater than that of a solder branch body 13 of the solder branch 11, the length of the pad 12 is greater than or equal to the width of the LED flip chip 3, and an electrode of the LED flip chip 3 is directly soldered on the pad 12. On the premise of ensuring that the LED flip chip 3 has enough soldering area, the solder branch 11 can be made softer to achieve a better force buffering effect, so that the soldering point of the LED flip chip 3 is less likely to be cracked by an external force during bending.

Specifically, toner glue 14 is provided at a position corresponding to each LED flip chip 3, and the toner glue 14 covers at least the LED flip chip 3 and the first through hole 9.

Specifically, a chip resistor 15 is further included. The chip resistor 15 is electrically connected laterally between the series line 8 on the outermost side and the power line 7.

Embodiment 3

Embodiment 3 is a series solution in which the LED flip chips 3 are placed horizontally: the power lines 7 and the series lines 8 are located on the same level, the power lines 7 are located on both sides of the series lines 8, the LED flip chips 3 are connected in series through the series lines 8 and then connected in parallel to the two power lines 7, the solder branches 11 extending from two adjacent series lines 8 are not on the same straight line, the two solder branches 11 are distributed in parallel up and down, pads 12 on the two solder branches 11 are on the same straight line in an up-down direction, the LED flip chips 3 are horizontally soldered on the two pads 12, and the length direction of the LED flip chips 3 is consistent with the width direction of the FPC.

Embodiment 4

Figure 10:
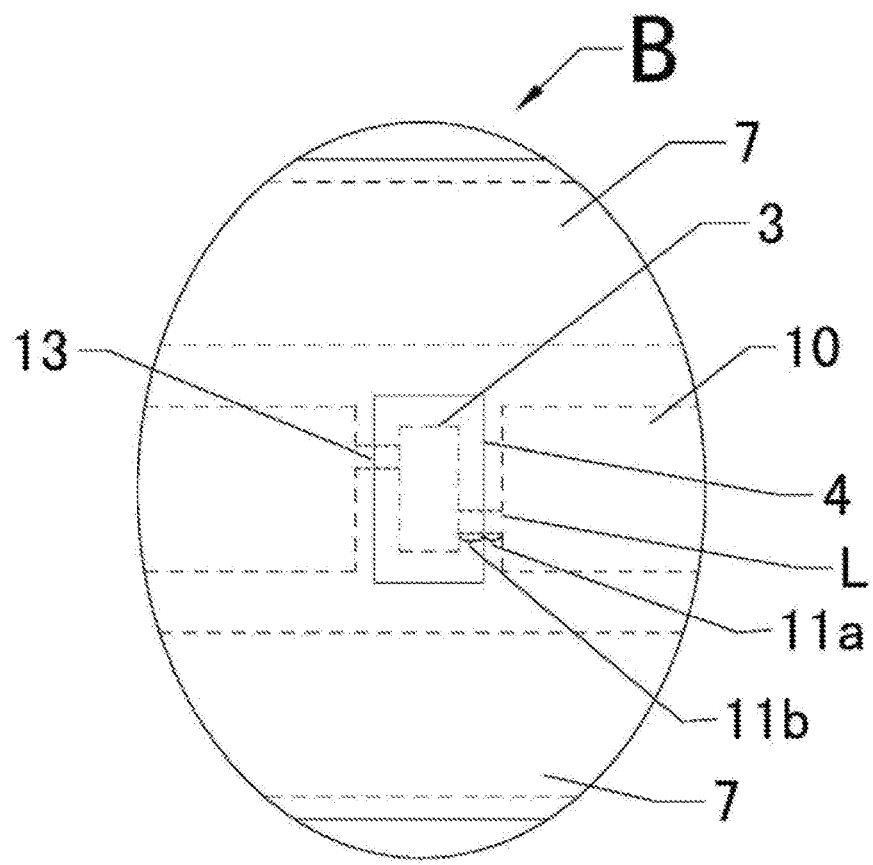
FIG. 10 is an enlarged view of part B in FIG. 9.
Figure 11:
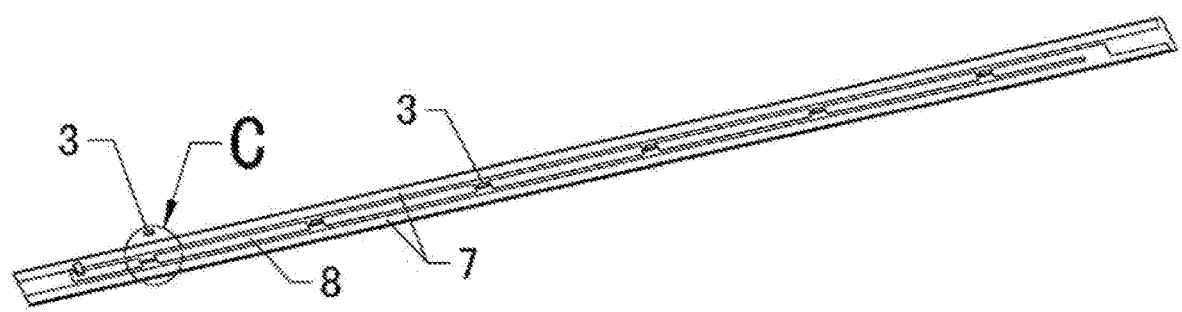
FIG. 11 is a stereogram of Embodiment 4 of a flexible LED flip flexible light bar of the present invention.
Figure 12:
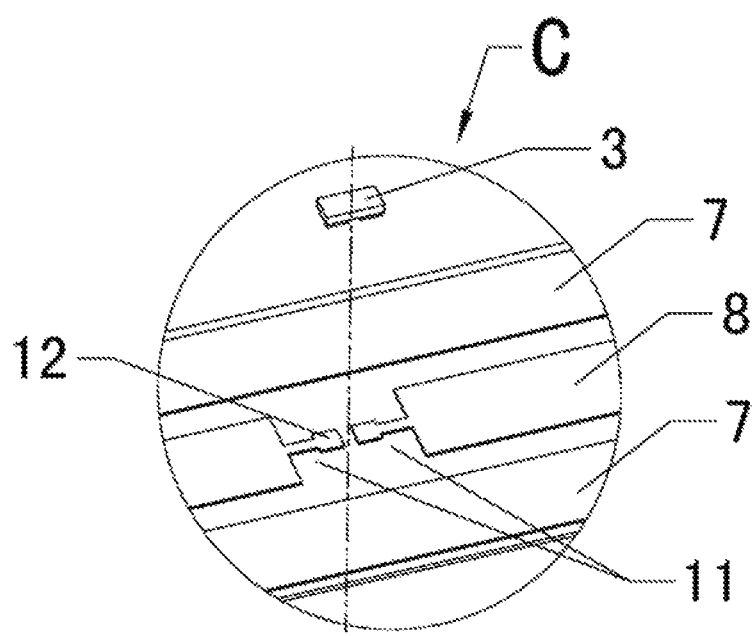
FIG. 12 is an enlarged view of part C in FIG. 11.

Referring to FIG. 10 and FIG. 11, its structure is substantially the same as that of Embodiment 3, and the main difference is that: Embodiment 4 is another series solution in which the LED flip chips 3 are placed vertically: the power lines 7 are located on both sides of the series lines 8, the LED flip chips 3 are connected in series through the series lines 8 and then connected in parallel to the two power lines 7, the solder branches 11 extending from two adjacent series lines 8 are on the same straight line, the width of the pad 12 is greater than that of the LED flip chips 3, the LED flip chips 3 are placed vertically, and the length direction of the LED flip chips 3 is consistent with the length direction of the FPC 2.

Embodiment 5

The structure of Embodiment 5 is substantially the same as that of Embodiment 3, and the main difference is that: Embodiment 5 is a parallel solution: the LED flip chips 3 are connected in parallel to two power lines 7 through parallel lines, respectively.

Embodiment 6

The structure of Embodiment 6 is substantially the same as that of Embodiment 3, and the main difference is that: Embodiment 6 is another series solution in which the series lines 8 and the power lines 7 are separated into two layers: the power lines 7 and the series lines 8 are located on two different levels, the two power lines 7 are located below the series lines 8, the LED flip chips 3 are connected in series through the series lines 8 and then connected to the two power lines 7 in parallel, and an intermediate insulating film is disposed between the power line 7 and the series line 8.

Compared with the conventional art, the beneficial effects of the present invention are as follows.

1. The product structure and process are simple, the production yield rate is higher and the manufacturing cost is lower. The product structure is simplified, a conventional support structure is removed, an LED flip chip is used to be soldered directly to a circuit board through solder paste instead, the support fixing, solid crystal, welding wire and other processes are eliminated, the occurrence of defective products such as glue explosion, virtual welding, and vulcanization are reduced, the investment of production equipment and labor is reduced, and the purpose of reducing the production cost is achieved.

2. The assembly line production is realized. The production process is relatively simple, continuous production can be concentrated in the same production line, and the production efficiency is higher.

3. The application is wider. The structure product is suitable for FPCs and PCBs. The size of the circuit board and chip can be designed according to needs, and the application is wider.

Although the embodiments of the present invention have been shown and described, those of ordinary skill in the art can understand that various changes, modifications, substitutions and variations can be made to these embodiments without departing from the principle and spirit of the present invention, and the scope of the present invention is defined by the appended claims and their equivalents.

What is claimed is:

1. An LED flexible light bar, comprising: a circuit board (2), wherein LED flip chips (3) are arranged at an upper end of the circuit board (2), and the LED flip chips (3) and the circuit board (2) are connected together by a plurality of solder paste bumps (16);
   wherein the circuit board (2) is a Flexible Printed Circuit (FPC);
   wherein the FPC comprises a top insulating film (4), an intermediate conductive circuit layer (5) and a bottom insulating film (6), the conductive circuit layer (5) comprises two power lines (7), a plurality of series lines (8), and the LED flip chips (3) are soldered on the series lines (8), the top insulating film (4) is provided with a first through hole (9) corresponding to the position of each LED flip chip (3), and the LED flip chips (3) are accommodated in the first through holes (9);
   wherein the series lines (8) comprise a series line body (10), an end of the series line body (10) close to the LED flip chip (3) is extended with a solder branch (11);
   the power lines (7) and the series lines (8) are located on the same level, the power lines (7) are located on both sides of the series lines (8), the LED flip chips (3) are connected in series through the series lines (8) and then connected in parallel to the two power lines (7), the solder branches (11) extending from two adjacent series lines (8) are not on the same straight line, the two solder branches (11) are distributed in parallel up and down, the LED flip chips (3) are placed horizontally, and the length direction of the LED flip chips (3) is consistent with the width direction of the FPC;
   the top insulating film (4) is pasted to cover a portion of the solder branch (11) close to the series line body (10);
   a joint (L) between the solder branch (11) and the series line body (10) is pasted and protected by the top insulating film (4).

2. The LED flexible light bar according to claim 1, wherein the LED flip chips (3) are further covered with toner glues (14).

3. The LED flexible light bar according to claim 2, wherein the circuit board (2) is wrapped by a flexible housing (1).

4. The LED flexible light bar according to claim 1, wherein a minimum distance between two adjacent solder paste bumps (16) of the same LED flip chip (3) is 0.12 mm.

5. The LED flexible light bar according to claim 1, wherein a minimum interval between the LED flip chips (3) is 0.08 mm.

6. The LED flexible light bar according to claim 1, wherein the LED flip chip (3) is soldered to an end of the solder branch (11);
   the top insulating film (4) is pasted to cover at least a portion of the solder branch (11) close to the series line body (10);
   a width of the solder branch (11) is less than half of a width of the series line body (10); and
   an end of the solder branch (11) close to the LED flip chip (3) is extended with a pad (12), a width of the pad (12) is greater than that of a solder branch body (13) of the solder branch (11), the width or length of the pad (12) is greater than or equal to a width of the LED flip chip (3), and an electrode of the LED flip chip (3) is directly soldered on the pad (12).

7. The LED flexible light bar according to claim 6, wherein a toner glue (14) is provided at a position corresponding to each LED flip chip (3), the toner glue (14) covering at least the LED flip chip (3) and the first through hole (9).

* * * * *